United States Patent
Li

(10) Patent No.: US 12,477,939 B2
(45) Date of Patent: Nov. 18, 2025

(54) DISPLAY PANEL, METHOD FOR MANUFACTURING DISPLAY PANEL, AND MOBILE TERMINAL

(71) Applicant: Wuhan China Star Optoelectronics Semiconductor Display Technology Co., Ltd., Wuhan (CN)

(72) Inventor: Dengqian Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/777,040

(22) PCT Filed: Mar. 17, 2022

(86) PCT No.: PCT/CN2022/081508
§ 371 (c)(1),
(2) Date: May 15, 2022

(87) PCT Pub. No.: WO2023/164982
PCT Pub. Date: Sep. 7, 2023

(65) Prior Publication Data
US 2024/0414995 A1    Dec. 12, 2024

(30) Foreign Application Priority Data

Mar. 4, 2022    (CN) .......................... 202210209722.2

(51) Int. Cl.
*H10K 71/00*    (2023.01)
*H10K 59/80*    (2023.01)

(52) U.S. Cl.
CPC ....... *H10K 59/8794* (2023.02); *H10K 71/621* (2023.02)

(58) Field of Classification Search
CPC .. H10K 59/8794; H10K 71/621; H10K 71/00; H10K 71/851; H10K 59/10; Y02P 40/57; G09F 9/301; G09F 9/33
(Continued)

(56) References Cited

U.S. PATENT DOCUMENTS

| 8,502,950 B2 * | 8/2013 | Kil ........................ G02F 1/1345 349/149 |
| 2005/0104828 A1 * | 5/2005 | Lee ..................... G02F 1/13452 345/87 |

(Continued)

FOREIGN PATENT DOCUMENTS

| CN | 108427216 A | 8/2018 |
| CN | 212724533 U | 3/2021 |

(Continued)

OTHER PUBLICATIONS

International Search Report in International application No. PCT/CN2022/081508, mailed on Nov. 30, 2022.

(Continued)

*Primary Examiner* — Sheikh Maruf
(74) *Attorney, Agent, or Firm* — Nathan & Associates Patent Agents Ltd.; Menachem Nathan

(57) ABSTRACT

Disclosed are a display panel, a method for manufacturing the display panel, and a mobile terminal, wherein the display panel is obtained after a panel is cut. The panel includes a panel body and a mark cutting portion, a first mark is disposed on the panel body, and a second mark is provided on the mark cutting portion. A support layer is formed on a side away from a light-emitting surface of the panel. The support layer comprises a body support portion and a to-be-cut support portion corresponding to the mark cutting portion, and an opening is disposed on the to-be-cut support portion corresponding to the second mark.

16 Claims, 10 Drawing Sheets

(58) Field of Classification Search
USPC .......................................................... 257/88
See application file for complete search history.

(56) References Cited

U.S. PATENT DOCUMENTS

| | | | | |
|---|---|---|---|---|
| 2005/0190174 | A1* | 9/2005 | Kim | .................... G02F 1/13452 345/204 |
| 2006/0267863 | A1* | 11/2006 | Kim | ..................... H05K 1/0215 345/51 |
| 2007/0091243 | A1* | 4/2007 | Hong | .................. G02F 1/13452 349/150 |
| 2008/0002130 | A1* | 1/2008 | Kil | ........................ G02F 1/1345 349/149 |
| 2008/0079656 | A1* | 4/2008 | Kee | ....................... G06F 1/1616 345/1.3 |
| 2009/0207102 | A1* | 8/2009 | Choi | ................. G02F 1/133308 345/58 |
| 2013/0002980 | A1* | 1/2013 | Meng | .................. H05K 9/0054 349/59 |
| 2013/0235012 | A1* | 9/2013 | Sheu | .................... G09G 3/2096 345/204 |
| 2014/0340601 | A1* | 11/2014 | Cheng | ............... G02F 1/136286 349/42 |
| 2016/0254485 | A1* | 9/2016 | Song | .................. H10K 59/8722 257/40 |
| 2016/0370644 | A1* | 12/2016 | Wang | ................ G02F 1/133526 |
| 2017/0153475 | A1* | 6/2017 | Li | ........................ G02F 1/1368 |
| 2017/0242290 | A1* | 8/2017 | Jenkins | ................ G02B 6/0036 |
| 2018/0013092 | A1* | 1/2018 | Park | .................... H10K 59/8723 |
| 2018/0364758 | A1* | 12/2018 | Jin | ......................... G06F 1/1637 |
| 2019/0049772 | A1* | 2/2019 | Chen | ................. G02F 1/133308 |
| 2019/0324586 | A1* | 10/2019 | Dai | ........................ H10K 59/40 |
| 2021/0199239 | A1* | 7/2021 | Lee | ......................... G09F 9/301 |
| 2021/0265457 | A1* | 8/2021 | Yueh | ................... G02F 1/13336 |
| 2021/0410270 | A1* | 12/2021 | Sun | ......................... H05K 1/028 |
| 2022/0189346 | A1* | 6/2022 | Dai | .......................... G09F 9/33 |
| 2022/0381958 | A1* | 12/2022 | Jeon | ....................... G06F 1/1652 |

FOREIGN PATENT DOCUMENTS

| | | |
|---|---|---|
| CN | 214335688 U | 10/2021 |
| CN | 113870706 A | 12/2021 |
| JP | 2004185945 A | 7/2004 |

OTHER PUBLICATIONS

Written Opinion of the International Search Authority in International application No. PCT/CN2022/081508, mailed on Nov. 30, 2022.

Chinese Office Action issued in corresponding Chinese Patent Application No. 202210209722.2 dated Sep. 2, 2022, pp. 1-6.

* cited by examiner providing a panel comprising a body region and a mark cutting region, wherein the panel further comprises a panel body located in the body region and a mark cutting portion located in the mark cutting region, the mark cutting portion is connected to the panel body, a first mark is formed on the panel body, and a second mark is formed on the mark cutting portion ⎯S1 forming a support layer on a side away from a light-emitting surface of the panel to obtain a display module, wherein the support layer comprises a body support portion located in the body region and a to-be-cut support portion located in the mark cutting region, the to-be-cut support portion is provided with an opening, and an orthographic projection of the opening on the panel body covers the second mark ⎯S2 identifying the first mark and the second mark on the panel, and bending and binding the display module ⎯S3 cutting the mark cutting portion and the to-be-cut support portion of the display module to form the display panel ⎯S4

FIG. 3 providing a panel comprising a body region and a mark cutting region, wherein the panel further comprises a panel body located in the body region and a mark cutting portion located in the mark cutting region, the mark cutting portion is connected to the panel body, a first mark is formed on the panel body, and a second mark is formed on the mark cutting portion ⟶ S1 forming a support layer on a side away from a light-emitting surface of the panel to obtain a display module, wherein the support layer comprises a body support portion located in the body region and a to-be-cut support portion located in the mark cutting region, the to-be-cut support portion is provided with an opening, and an orthographic projection of the opening on the panel body covers the second mark ⟶ S2 forming a functional layer on a side of the light-emitting surface of the panel, wherein the functional layer comprises a first protection portion located in the mark cutting region, an orthographic projection of the first protection portion on the panel body in a direction perpendicular to the panel covers the second mark, and the first protection portion is a light-transmitting structure ⟶ S2-1 identifying the first mark and the second mark on the panel, and bending and binding the display module ⟶ S3 cutting the mark cutting portion and the to-be-cut support portion of the display module to form the display panel ⟶ S4

FIG. 4

DISPLAY PANEL, METHOD FOR MANUFACTURING DISPLAY PANEL, AND MOBILE TERMINAL

TECHNICAL FIELD

The present application relates to the field of display, and in particular, to a display panel, a method for manufacturing the display panel, and a mobile terminal.

BACKGROUND

Currently, in order to further reduce a width of a lower frame of a foldable flexible organic electroluminescence display (OLED) module, a binding terminal on the lower side of the module is generally bound to the back of the module, which is referred to as a pad bending and binding technology.

In the pad bending and binding process, marks in a pad bending and binding region and marks in a non-pad bending and binding region on the panel need to be photographed respectively with a charge coupled device (CCD) (e.g., camera), for positioning positions of the bending and binding in X/Y-direction.

Since a metal support layer on the display panel is made of a non-transparent material, it is necessary to perform slotting of the metal support layer, in order to photograph and identify the marks in the non-pad bending and binding region on the panel by the CCD camera, as shown in FIGS. 1 and 2. In the case of the metal support layer, the slotting causes a reduction in the strength of the metal support layer and, in particular, a significant increase in the risk of cracking after collision of the metal support layer with foreign objects.

Technical Problems

Embodiments of the present application provide a display panel, a method of manufacturing the display panel, and a mobile terminal, so as to solve technical problems that the support layer needs to be additionally treated with deep slotting to identify the marks on the panel for bending and binding, which reduces the strength of the support layer, and increase the risk of cracking of the support layer, when the display panel is bent and bound.

Technical Solutions

To solve the above problems, the present application provides the following technical solutions.

An embodiment of the present application provides a method of manufacturing a display panel, comprising the following steps:
  providing a panel comprising a body region and a mark cutting region, wherein the panel further comprises a panel body located on the body region and a mark cutting portion located on the mark cutting region, the mark cutting portion is connected to the panel body, a first mark is formed on the panel body, and a second mark is formed on the mark cutting portion;
  forming a support layer on a side away from a light-emitting surface of the panel to obtain a display module, wherein the support layer comprises a body support portion located in the body region and a to-be-cut support portion located in the mark cutting region, the to-be-cut support portion is provided with an opening, and an orthographic projection of the opening on the panel body covers the second mark;
  identifying the first mark and the second mark on the panel, and bending and binding the display module;
  cutting the mark cutting portion and the to-be-cut support portion of the display module to form the display panel.

In an embodiment, before the step of identifying the first mark and the second mark on the panel and bending and binding the display module, the method further comprises:
  forming a functional layer on a side of the light-emitting surface of the panel, wherein the functional layer comprises a first protection portion located in the mark cutting region;
  wherein an orthographic projection of the first protection portion on the panel body in a direction perpendicular to the panel covers the second mark, and the first protection portion is a light-transmitting structure.

In an embodiment, before the step of forming the support layer on the side away from the light-emitting surface of the panel to obtain the display module, wherein the support layer comprises the body support portion located in the body region and the to-be-cut support portion located in the mark cutting region, the to-be-cut support portion is provided with the opening, and the orthographic projection of the opening on the panel body covers the second mark, the method further comprises:
  forming a back plate on a side away from the light-emitting surface of the panel, wherein the back plate comprises a second protection portion located in the mark cutting region;
  wherein an orthographic projection of the second protection portion on the panel body in a direction perpendicular to the panel body covers the second mark, and a material for forming the second protection portion is a light-transmitting material.

In an embodiment, in the step of cutting the mark cutting portion and the to-be-cut support portion of the display module to form the display panel, the cutting step comprises laser cutting.

The present application further provides a display panel comprising:
  a panel body comprising a sub-binding region, wherein the panel body is provided with a first mark located in the sub-binding region, and an edge of the panel body comprises at least one panel body cutout;
  a support layer located on a side of a light-emitting surface of the panel, wherein a support layer cutout is disposed on an edge of the support layer corresponding to the panel body cutout;
  wherein an orthographic projection of an edge of the panel body cutout overlaps with an orthographic projection of an edge of the support layer cutout in a direction perpendicular to the panel body.

In an embodiment, the panel body cutout comprises a first inner groove or a first outer convex portion, and the corners of the first inner groove and the first outer convex portion are rounded.

The support layer cutout comprises a second inner groove or a second outer convex portion, and the corners of the second inner groove and the second outer convex portion are rounded.

In an embodiment, a depth of the first inner groove or an outwardly protruding distance of the first outer convex portion is 0-0.3 mm.

In an embodiment, the display panel further comprises a functional layer disposed on a side of a light-emitting surface of the panel body, wherein a functional layer cutout is disposed on an edge of the functional layer corresponding to the panel body cutout, and an orthographic projection of an edge of the panel body cutout overlaps with an orthographic projection of an edge of the functional layer cutout in the direction perpendicular to the panel body.

In an embodiment, the display panel further comprises a back plate located between the support layer and the panel body, wherein the back plate cutout is disposed on an edge of the back plate corresponding to the panel body cutout, and an orthographic projection of an edge of the panel body cutout overlaps with an orthographic projection of an edge of the back plate cutout in the direction perpendicular to the panel body.

In an embodiment, an edge of the panel body comprises two of the panel body cutouts, and the two of the panel body cutouts are respectively disposed on side edges of the panel body near the sub-binding region.

In an embodiment, the panel body comprises at least two of the first marks located in the sub-binding region, the number of the first marks is equal to the number of the panel body cutouts, and one of the first marks corresponds to one of the panel body cutouts.

In an arrangement of one of the first marks corresponding to one of the panel body cutouts, a distance between the first mark and the corresponding panel body cutout is less than or equal to a distance between the first mark and any one of other panel body cutout.

In an embodiment, the first mark is a cross-shaped or a T-shaped mark.

The present application further provides a mobile terminal comprising a display panel and a terminal body, wherein the terminal body is integrated with the display panel.

The display panel comprises:
a panel body comprising a sub-binding region, wherein the panel body is provided with a first mark located in the sub-binding region, and an edge of the panel body comprises at least one panel body cutout;
a support layer located on a side of a light-emitting surface of the panel, wherein a support layer cutout is disposed on an edge of the support layer corresponding to the panel body cutout;
wherein an orthographic projection of an edge of the panel body cutout overlaps with an orthographic projection of an edge of the support layer cutout in a direction perpendicular to the panel body.

In an embodiment, the panel body cutout comprises a first inner groove or a first outer convex portion, and the corners of the first inner groove and the first outer convex portion are rounded.

The support layer cutout comprises a second inner groove or a second outer convex portion, and the corners of the second inner groove and the second outer convex portion are rounded.

In an embodiment, a depth of the first inner groove or an outwardly protruding distance of the first outer convex portion is 0-0.3 mm.

In an embodiment, the mobile terminal further comprises a functional layer disposed on a side of a light-emitting surface of the panel body, wherein a functional layer cutout is disposed on an edge of the functional layer corresponding to the panel body cutout, and an orthographic projection of an edge of the panel body cutout overlaps with an orthographic projection of an edge of the functional layer cutout in the direction perpendicular to the panel body.

In an embodiment, the mobile terminal further comprises a back plate located between the support layer and the panel body, wherein the back plate cutout is disposed on an edge of the back plate corresponding to the panel body cutout, and an orthographic projection of an edge of the panel body cutout overlaps with an orthographic projection of an edge of the back plate cutout in the direction perpendicular to the panel body.

In an embodiment, an edge of the panel body comprises two of the panel body cutouts, and the two of the panel body cutouts are respectively disposed on side edges of the panel body near the sub-binding region.

In an embodiment, the panel body comprises at least two of the first marks located in the sub-binding region, the number of the first marks is equal to the number of the panel body cutouts, and one of the first marks corresponds to one of the panel body cutouts.

In an arrangement of one of the first marks corresponding to one of the panel body cutouts, a distance between the first mark and the corresponding panel body cutout is less than or equal to a distance between the first mark and any one of other panel body cutout.

In an embodiment, the first mark M1 is a cross-shaped or a T-shaped mark.

BENEFICIAL EFFECTS

The present application provides the panel comprising the panel body and the mark cutting portion. The first mark is disposed on the panel body, and the second mark is disposed on the mark cutting portion. The support layer is disposed on the side away from the light-emitting surface of the panel, and comprises the body support portion corresponding to the panel body and the to-be-cut support portion corresponding to the mark cutting portion. The opening is disposed at a position of the to-be-cut support portion corresponding to the second mark. After bending and binding, the mark cutting portion and the to-be-cut support portion corresponding the display module are cut, so that the panel body cutout is formed on the panel body, and the support layer cutout is formed on the support layer. By the above configuration, there is no need to provide a deep groove or opening in the support layer of the display panel, thereby effectively ensuring strength of the support layer, reducing the risk of cracking of the support layer after being hit with foreign objects, and improving the quality of the display panel.

DESCRIPTION OF THE DRAWINGS

FIG. 3 is a flowchart of manufacturing a display panel according to an embodiment of the present application.

FIG. 4 is a flowchart of manufacturing another display panel according to an embodiment of the present application.

EMBODIMENTS OF THE PRESENT INVENTION

Figure 1:
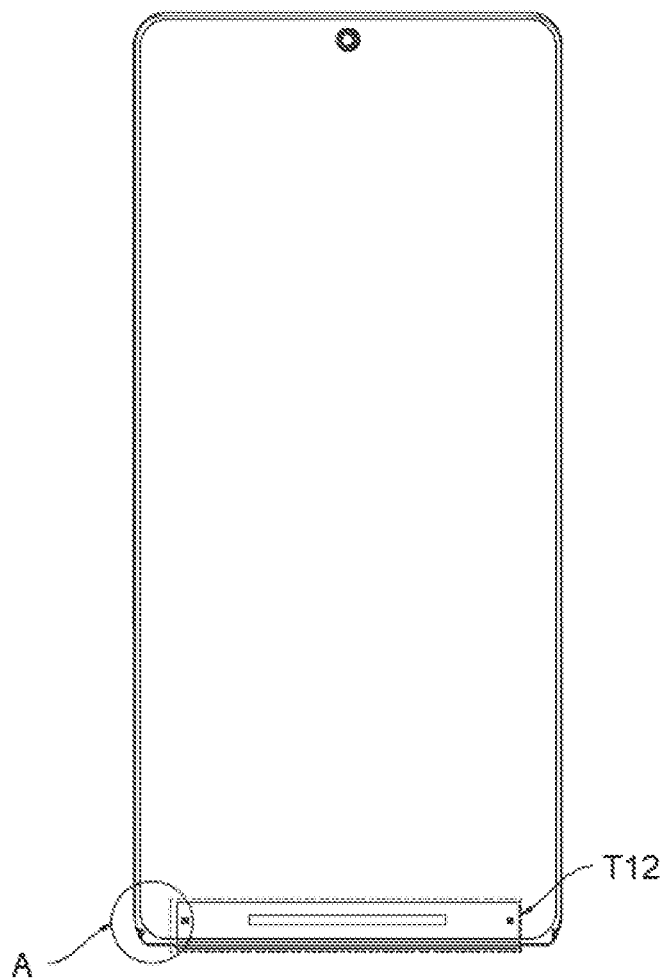
FIG. 1 is a schematic structural diagram of a conventional display module.
Figure 2:
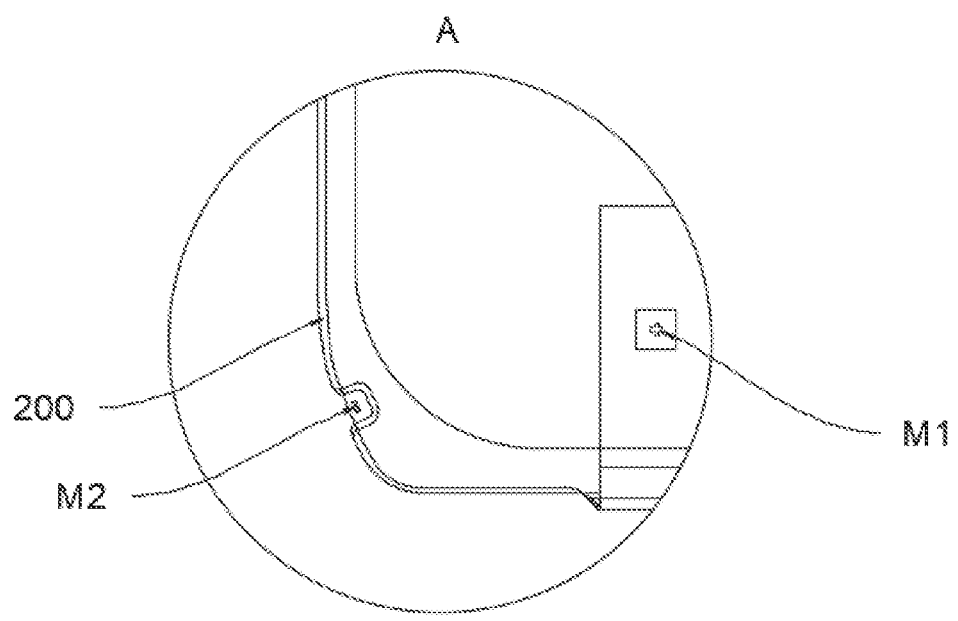
FIG. 2 is an enlarged view at A in FIG. 1.

The present application provides a display panel, a method for manufacturing the display panel, and a mobile terminal. In order to make the objective, technical solutions, and effects of the present application more clear and explicit, the present application will be further described in detail below with reference to the accompanying drawings and embodiments. It should be understood that the specific embodiments described herein are intended to explain the present application only and not to limit the present application.

Embodiments of the present application provide a display panel, a method for manufacturing the display panel, and a mobile terminal. Detailed description will be given below. It should be noted that the order of description of the following embodiments is not a limitation on the preferred order of the embodiments.

An embodiment of the present application provides a method for manufacturing a display panel, as shown in FIG. 3, comprising the following steps:

S1. providing a panel comprising a body region T1 and a mark cutting region T2, wherein the panel further comprises a panel body 101 located in the body region T1 and a mark cutting portion 102 located in the mark cutting region T2, and the mark cutting portion 102 is connected to the panel body 101; a first mark M1 is formed on the panel body 101, and a second mark M2 is formed on the mark cutting portion 102;

S2. forming a support layer 200 on a side away from a light-emitting surface of the panel to obtain a display module, wherein the support layer 200 comprises a body support portion 201 located in the body region T1 and a to-be-cut support portion 202 located in the mark cutting region T2, an opening 203 is disposed on the to-be-cut support portion 202, and an orthographic projection of the opening 203 on the panel body 101 covers the second mark M2;

S3. identifying the first mark M1 and the second mark M2 on the panel, and bending and binding the display module; and S4. cutting the mark cutting portion 102 and the to-be-cut support portion 202 of the display module to form the display panel.

Specifically, as shown in FIGS. 6, 7, 8 and 9, the panel comprises the body region T1 and the mark cutting region T2, and the body region T1 comprises a sub-binding region T12.

Specifically, the mark cutting region T2 is located around the body region T1. For example, the mark cutting region T2 may be an annular structure surrounding the body region T1. Alternatively, the mark cutting region T2 may be a region having a larger area than the second mark M2, and the mark cutting region T2 is adjacent to the body region T1. This embodiment is illustrated in the second setting.

Specifically, the sub-binding region T12 is located within the body region T1 and located on an edge of the body region T1. The mark cutting region T2 may be disposed near the sub-binding region T12, however a specific location of the mark cutting region T2 is not limited.

Figure 7:
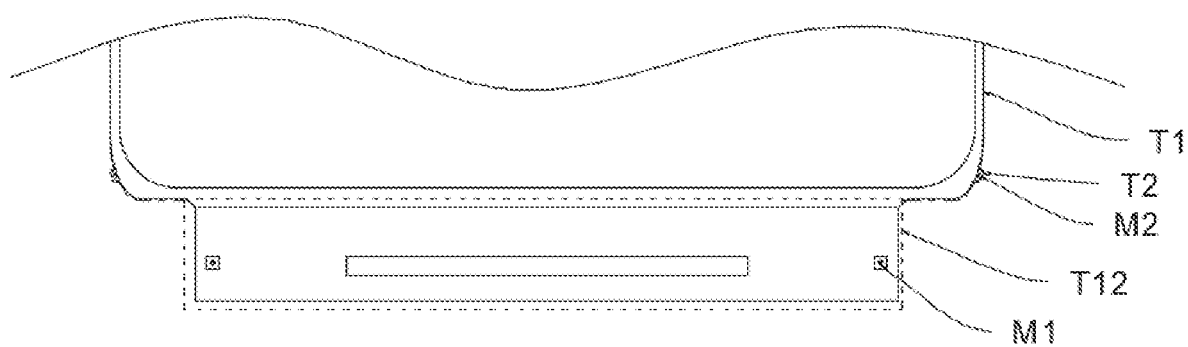
FIG. 7 is a schematic structural diagram of a display panel near a binding region according to an embodiment of the present application.
Figure 10:
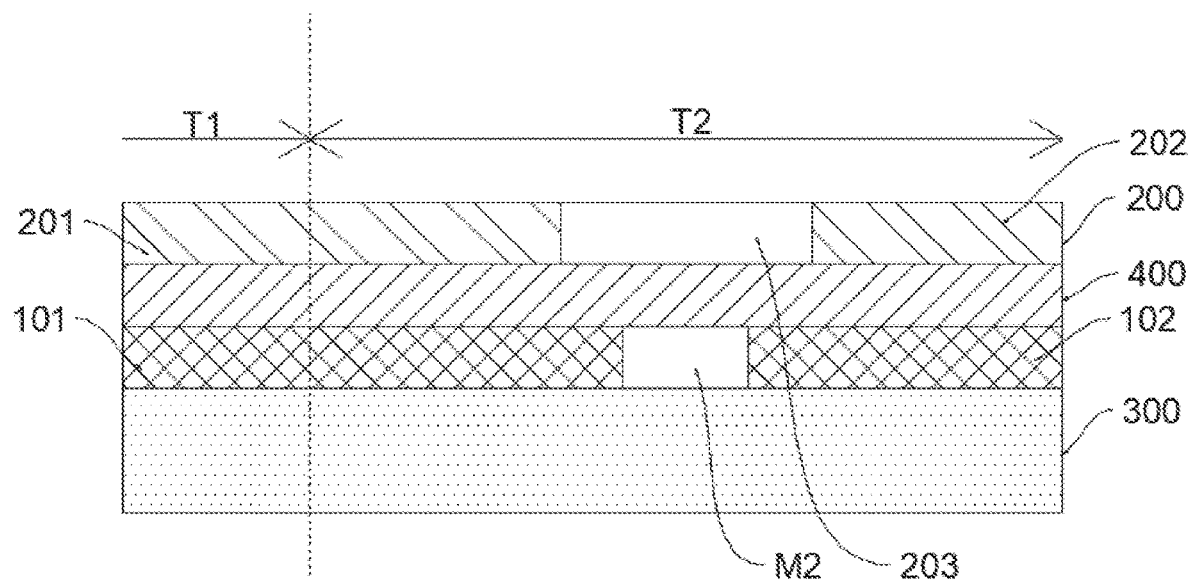
FIG. 10 is a schematic structural diagram of a film layer of a display panel according to an embodiment of the present application.
Figure 11:
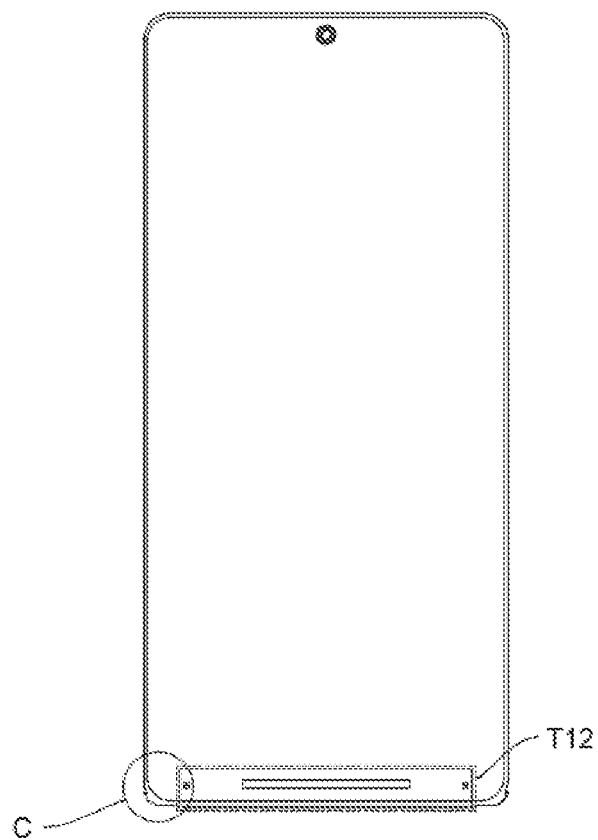
FIG. 11 is a schematic structural diagram of a display panel according to an embodiment of the present application.
Figure 12:
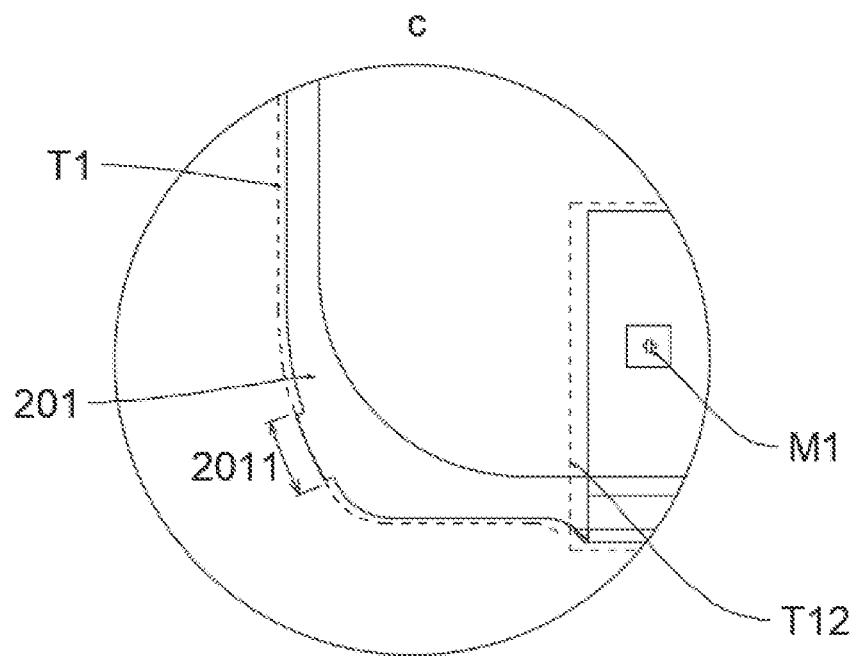
FIG. 12 is an enlarged view at C of FIG. 11.
Figure 13:
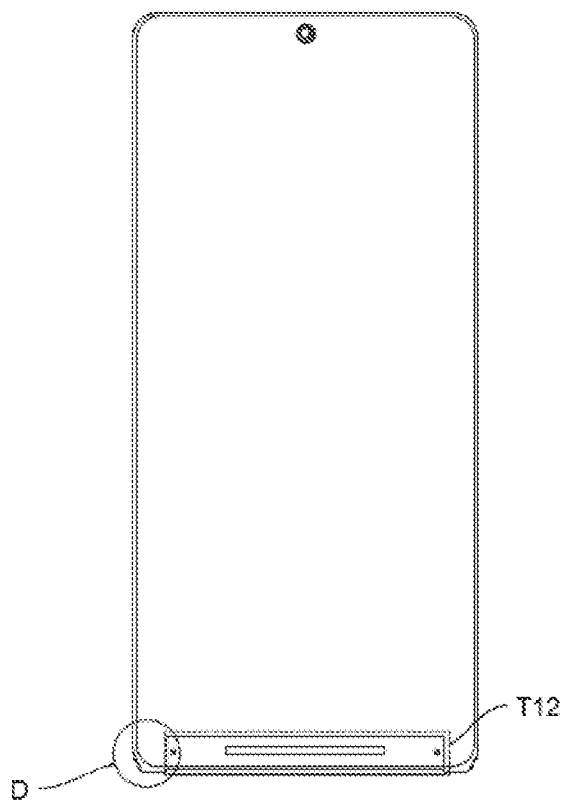
FIG. 13 is a schematic structural diagram of a display panel according to an embodiment of the present application.
Figure 14:
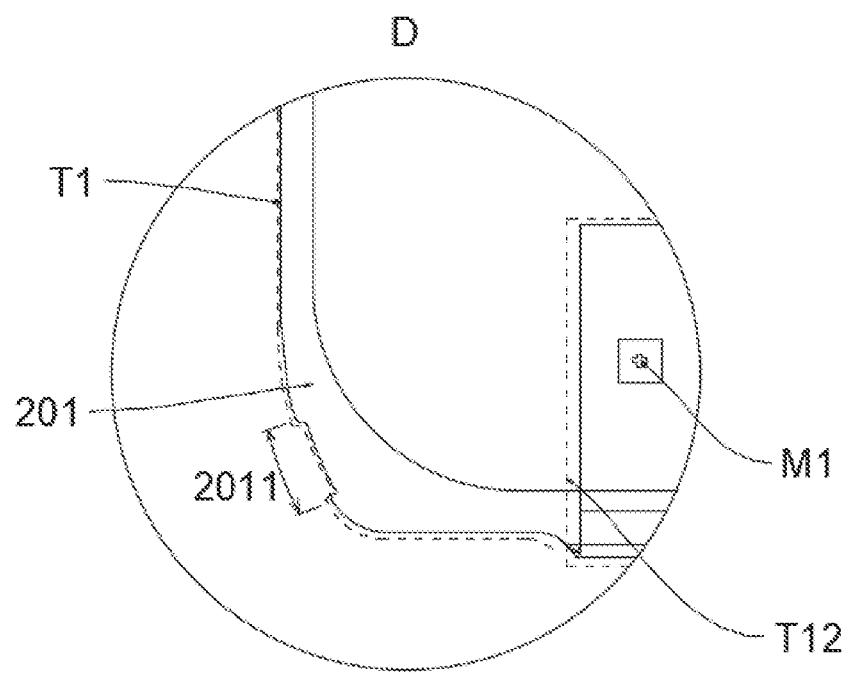
FIG. 14 is an enlarged view at D of FIG. 13.

Specifically, as shown in FIGS. 7 and 10, the panel comprises:
the panel body 101 located on the body region T1, wherein the panel body 101 is provided with the first mark M1 located on the sub-binding region T12; and
the mark cutting portion 102 located in the mark cutting region T2 and connected to the panel body 101, wherein the mark cutting portion 102 is provided with the second mark M2 located on the mark cutting region T2.

Specifically, the panel body 101 may be integrated with the mark cutting portion 102. The panel body 101 comprises a region having a display function and a frame region, and the mark cutting portion 102 does not have display function and located on the frame region of the display function layer.

Specifically, the first mark M1 is disposed on the panel body 101 and located on the sub-binding region T12. The number of the first marks M1 is not limited, and may be one or two. Preferably, the number of the first marks M1 is the same as that of the second marks M2, and the first mark M1 is disposed near the second marks M2. A shape of the first mark M1 is not limited. For example, the first mark M1 may be a cross-shaped mark, a T-shaped mark, or a mark having other shapes, and all of shapes that can have a marking effect are within the scope of the present application. The first mark M1 may include a structure penetrating the panel body 101.

Figure 8:
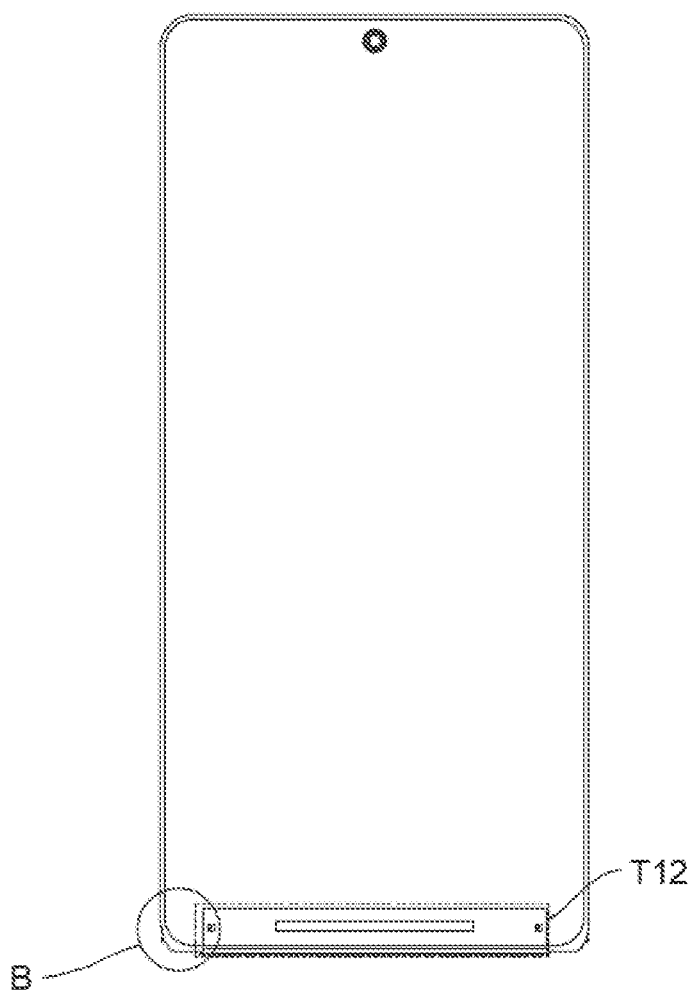
FIG. 8 is a schematic structural diagram of a display module according to an embodiment of the present application.

Specifically, the second mark M2 is disposed on the mark cutting portion 102. The number of the second marks M2 is not limited, and may be one or two. Preferably, the number of the first marks M1 is the same as that of the second marks M2. As shown in FIG. 7, in the case that the number of the first markers M1 is the same as that of the second markers M2, the corresponding first marker M1 and second marker M2 are disposed close to each other to further increase the accuracy of positioning. In this embodiment, the number of the second marker M2 that can coordinate with the first marker M1 and achieve positioning of the bending and binding falls within the scope of the present application, and the structure after bending and binding is shown in FIGS. 8 and 9.

Figure 9:
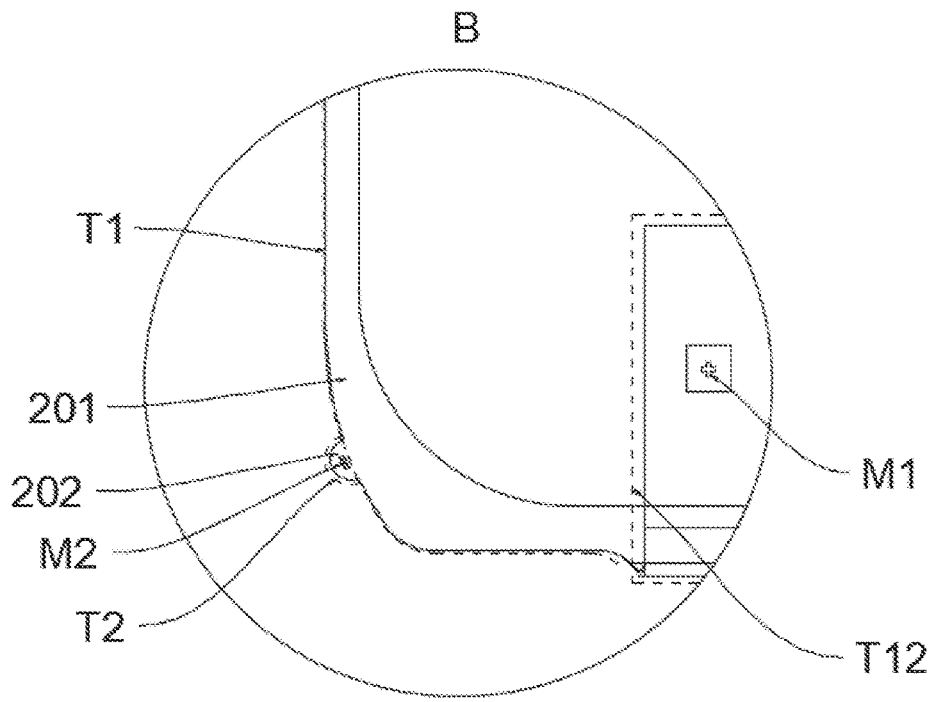
FIG. 9 is an enlarged view at B of FIG. 8.

Specifically, as shown in FIG. 9, the second mark M2 may be a cross-shaped mark (as shown in this embodiment), a T-shaped mark, or a mark having other shapes, and all of shapes that can have a marking effect are within the scope of the present application. As shown in FIG. 10, the second mark M2 may include a structure penetrating the mark cutting portion 102.

Specifically, the mark cutting portion 102 may be a convex structure, which may include a semi-island-like structure formed by outwardly extending from the edge portion of the panel body 101.

Specifically, the mark cutting portion 102 may be a C-shaped structure that half surrounds the panel body 101. That is, the mark cutting portion 102 is not adjacent to the panel body 101 of the sub-binding region T12, so as to prevent affecting the bending and binding.

Specifically, the mark cutting region T2 comprises at least two sub-mark cutting regions disposed at intervals, and the mark cutting portion 102 comprises at least two sub-mark cutting portions. One of the sub-mark cutting regions is provided with one of the sub-mark cutting portions, and one of the second marks M2 is disposed on each of the sub-mark cutting portions. The sub-mark cutting portion is disposed on a side edge of the panel body 101 near the sub-binding region T12.

Specifically, the mark cutting region T2 may comprise at least two sub-mark cutting regions disposed at intervals, and the mark cutting portion 102 comprises at least two sub-mark cutting portions. The shape of the sub-mark cutting portions is not limited, and the sub-mark cutting portion may be a rectangular shape, a strip-shape, or a fan-shape. The number of the sub-mark cutting portions may be equal to that of the sub-mark cutting regions, or a plurality of sub-mark cutting portions may be disposed in each of the sub-mark cutting regions, and the specific number can be set according to the actual production needs.

Specifically, two sub-mark cutting portions disposed at an interval may be respectively located on sides of a binding region of the panel body 101. The mark cutting region T2 comprises at least two sub-mark cutting regions disposed at intervals, the mark cutting portion 102 comprises at least two sub-mark cutting portions, and each of the mark cutting regions T2 corresponds to at least one of the sub-mark cutting portions, so that the accuracy of positioning for the first mark M1 and the second mark M2 can be further improved, and the accuracy of binding can be further improved to increase the accuracy of the display panel.

The support layer 200 is further formed on a side away from the light-emitting surface of the panel. The support layer 200 comprises a body support portion 201 located on the body region T1 and a to-be-cut support portion 202 located on the mark cutting region T2. The opening 203 is disposed on the to-be-cut support portion 202, and an orthographic projection of the opening 203 on the panel body 101 covers the second mark M2.

Specifically, the support layer 200 is formed on a side away from the light-emitting surface of the panel. The material for forming the support layer 200 may be a metal or a material having a certain hardness. The support layer 200 is mainly used to support the panel. When the material for forming the support layer 200 is a metal having good heat conductivity, a certain heat dissipation effect may be achieved.

Specifically, the support layer 200 comprises a body support portion 201 corresponding to the panel body 101 and a to-be-cut support portion 202 located on the mark cutting region T2. Since the metal does not have a property of transmitting light, the opening 203 is disposed on a region of the to-be-cut support portion 202 corresponding to the second mark M2 to expose the second mark M2 for aligning with the first marker M1.

It should be noted that, a process for manufacturing the display panel comprises three cutting steps, specifically comprises: providing a mother board having a first cutting line (dividing the mother board into a plurality of small sub-boards, each sub-board corresponding to a display panel), and performing a first cutting step for the mother board along the first cutting line according to a size required by the display panel, to obtain a sub-board (e.g., a rectangular sub-board) having the size (e.g., length and width) corresponding to the display panel;

performing a second cutting step for the sub-board along a second cutting line for trimming, wherein the second cutting line is an outer profile line of the display panel (before cutting the mark cutting portion 102 and to-be-cut support portion 202), and bending and binding the resulting display module; and performing a third cutting step for the bent and bound display panel (before cutting the mark cutting portion 102 and the to-be-cut support portion 202) along a third cutting line, wherein the third cutting step is mainly used to cut a region (comprising the mark cutting portion 102 and the to-be-cut support portion 202) of the display module corresponding to the second mark M2, and the third cutting line is parallel to an outer profile line of a finished display panel product.

Specifically, in step S3, a method for identifying the first mark M1 and the second mark M2 may comprise: taking a photograph with a CCD camera, positioning in the X/Y direction of bending and binding according to positions of the first the first mark M1 and the second mark M2 on the photograph, and then performing the bending and binding.

Specifically, in step S4, the mark cutting portion 102 and the to-be-cut support portion 202 are cut, wherein the cutting step can be performed with laser light, and the accuracy of cutting is controlled within a range of +0.05 mm with respect to the required.

Specifically, after step S4, it is further necessary to detect an appearance of the module by an apparatus or a manpower, and then to pack it.

Specifically, the mark cutting portion 102 and the to-be-cut support portion 202 are subjected to the third cutting step to cut the second mark M2, wherein the third cutting step is operated along the third cutting line.

It can be understood that, the present application provides the panel comprising the panel body 101 and the mark cutting portion 102. The first mark M1 is disposed on the panel body 101, and the second mark M2 is disposed on the mark cutting portion 102. The support layer 200 is disposed on the side away from the light-emitting surface of the panel, and comprises the body support portion 201 corresponding to the panel body 101 and the to-be-cut support portion 202 corresponding to the mark cutting portion 102. The opening 203 is disposed at a position of the to-be-cut support portion 202 corresponding to the second mark M2. After bending and binding, the mark cutting portion 102 and the to-be-cut support portion 202 corresponding to the display module are cut, so that the panel body cutout is formed on the panel body, and the support layer cutout 2011 is formed on the support layer 200. By the above configuration, there is no need to provide a deep groove or opening in the support layer of the display panel, thereby effectively ensuring the strength of the support layer, reducing the risk of cracking of the support layer after being hit with foreign objects, and improving the quality of the display panel.

In an embodiment, as shown in FIG. 4, before the steps of identifying the first mark M1 and the second mark M2 on the panel and bending and binding the display module, the method further comprises:

S2-1. forming a functional layer 300 on a side of a light-emitting surface of the panel, wherein the functional layer 300 comprises a first protection portion located on the mark cutting region T2, an orthographic projection of the first protection portion on the panel body 101 in a direction perpendicular to the panel covers the second mark M2, and the first protection portion is a light-transmitting structure.

Specifically, the functional layer 300 may be a polarizing sheet layer, and the material for forming the polarizing sheet layer has a light-transmitting function and a high hardness to support the mark cutting portion 102.

Specifically, the functional layer 300 may include a polarizer, a touch layer or the like, and the specific structure thereof is not limited. The functional layer 300 may include a structure formed by stacking a plurality of layers.

It can be understood that, by providing a first protection portion on the functional layer 300 that is located on a side of the light-emitting surface of the panel body 101, the mark cutting portion 102 may be supported by the first protection portion, so as to avoid the displacement of the second mark M2 during photographing due to an overly soft material of the mark cutting part 102, thereby improving the positioning accuracy of the bending and binding.

Figure 5:
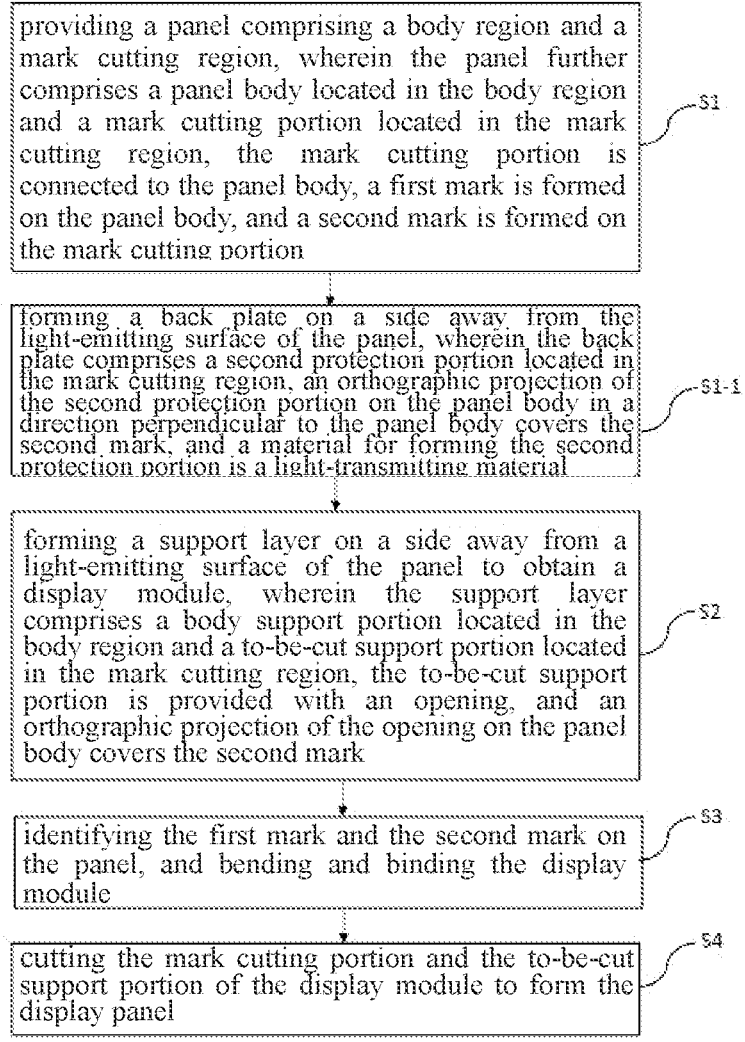
FIG. 5 is a flowchart of manufacturing yet another display panel according to an embodiment of the present application.
Figure 6:
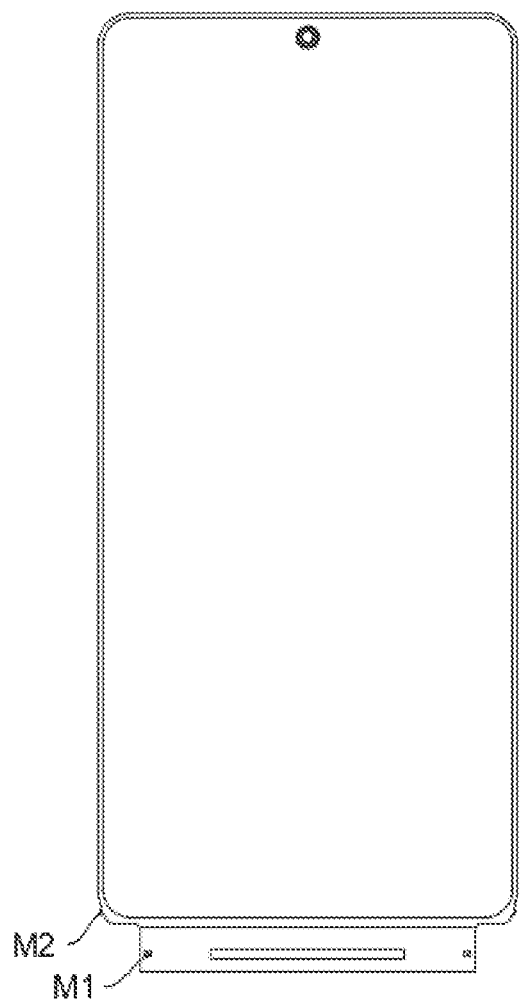
FIG. 6 is a schematic structural diagram of a display panel before a second cutting step according to an embodiment of the present application.

In an embodiment, as shown in FIG. 5, before the step of forming the support layer 200 on the side away from the light-emitting surface of the panel to form the display module, wherein the support layer 200 comprises the body support portion 201 located on the body region T1 and the to-be-cut support portion 202 located on the mark cutting region T2, the opening 203 is disposed on the to-be-cut support portion 202, and the orthographic projection of the opening 203 on the panel body 101 covers the second mark M2, the method further comprises:

S1-1. forming a back plate 400 on the side away from the light-emitting surface of the panel, wherein the back plate 400 comprises a second protection portion located on the mark cutting region T2, an orthographic projection of the second protection portion on the panel body 101 in a direction perpendicular to the panel body 101 covers the second mark M2, and a material for forming the second protection portion is a light-transmitting material.

Specifically, a material for forming the back plate 400 may be polyimides (PI), polyethylene terephthalates (PET), or polyesters (BOPET), which are transparent or light-transmissive during use, so as to avoid affecting the positioning of the second mark M2. The back plate 400 has a higher hardness than that of the display function layer. The second protection portion may play a supporting role for the mark cutting portion 102, and fix the mark cutting portion 102 in combination with the first protection portion.

It can be understood that, by providing a second protection portion on the back plate 400 that is located on a backlight surface of the panel body 101, the mark cutting portion 102 is fixed by the second protection portion, in combination with the first protection portion. Meanwhile, the second protection portion may function as a support to prevent the second mark 102 from being displaced due to an overly soft material of the mark cutting portion 102, thereby improving the accuracy of bending and binding.

It should be noted that, in another embodiment, the back plate 400 and/or the functional layer 300 may or may not cover the second mark M2. When the back plate 400 or the functional layer 300 covers the second mark M2, a material or a structure of the back plate 400 and the functional layer 300 is accordingly limited, that is, the material or the structure of the back plate 400 and the functional layer 300 needs to be a material or a structure having a light-transmitting property that cannot interfere with the CCD camera to capture the second marker M2.

In an embodiment, in the step of cutting the mark cutting portion 102 and the to-be-cut support portion 202 of the display module to form the display panel, the cutting step includes laser cutting.

Specifically, the accuracy of the laser cutting is controlled within a range of ±0.05 mm with respect to the required.

Specifically, after cutting, the edge of the display panel may generate cutouts due to a cutting error, in which a panel body cutout is formed on the panel body 101, and a support layer cutout 2011 is formed on the support layer 200.

It can be understood that the accuracy of the laser cutting is higher than that of other cutting methods, thereby generating a higher yield of the resulting display panel.

The present application further provides a display panel comprising:

a panel body 101 comprising a sub-binding region T12, wherein the panel body 101 is provided with a first mark M1 located in the sub-binding region T12, and an edge of the panel body 101 comprises at least one panel body cutout;

a support layer 200, wherein the support layer 200 is located on a side of a light-emitting surface of the panel, and a support layer cutout 2011 is disposed on an edge of the support layer 200 corresponding to a panel body cutout;

wherein an orthographic projection of an edge of the panel body overlaps with an orthographic projection of an edge of the support layer cutout 2011 in a direction perpendicular to the panel body 101.

It should be noted that, as described in the method for manufacturing the display panel, before the third cutting step, the panel further comprises the mark cutting portion 102 connected to the panel body 101, wherein the mark cutting portion 102 comprises at least one sub-mark cutting portion, and at least one panel body cutout is formed after the mark cutting portion 102 is cut.

The support layer 200 further comprises the body support portion 201 and the to-be-cut support portion 202 connected to the body support portion 201. The to-be-cut support portion 202 comprises at least one sub to-be-cut support portion, and the sub to-be-cut support portion is provided with the opening 203. An orthographic projection of the opening 203 on the panel body 101 covers the second mark M2.

Specifically, as shown in FIGS. 11, 12, 13, and 14, the display panel is formed according to the method of manufacturing the display panel described above. After the third cutting step, a plurality of panel body cutouts are formed at positions where the mark cutting portion 102 is cut, and a plurality of support layer cutouts 2011 are formed at positions where the to-be-cut support portion 202 is cut.

Specifically, the related description of the structure and material of the panel body 101 and the support layer 200 can refer to the method of manufacturing the display panel as described above.

In an embodiment, the panel body cutout comprises a first inner groove or a first outer convex portion, and the corners of the first inner groove and the first outer convex portion are rounded.

The support layer cutout 2011 comprises a second inner groove or a second outer convex portion, and the second inner groove and the corners of the second outer convex portion are rounded.

Specifically, in the third cutting process of the display panel, it is necessary to ensure that no sharp corner is generated at cutouts of the display panel after cutting.

An inner groove or outer convex portion may be generated near the second mark M2 due to a cutting error, and the corners of the inner groove (the first inner groove and the second inner groove) or the outer convex portion (the first outer convex portion and the second outer convex portion) are rounded. The size of the rounded corner is between 0.05-2 mm (R) and the depth of the inner groove (the first inner groove and the second inner groove) or the outer convex portion (the first outer convex portion and the second outer convex portion) is 0-0.3 mm.

It can be understood that, the strength of the support layer 200 can be enhanced by providing the cut ends as an inner groove or an outer convex portion, and by setting the cut end as a rounded corner, the stress inside the support layer 200 and the probability of cracking of the support layer 200 after being hit can be reduced.

In an embodiment, a depth of the first inner groove or an outwardly protruding distance of the first outer convex portion is 0-0.3 mm.

It can be understood that limiting the depth of the inner grooves can prevent the strength of the support layer 200 from being reduced due to an overly deep depth of the groove. Limiting the outwardly protruding distance of the outer convex portions can reduce the probability of cracking of the support layer 200 after being hit, and improve the life of the display panel.

In an embodiment, the display panel further comprises the functional layer 300 disposed on the side of the light-emitting surface of the panel body 101. A functional layer cutout is disposed on an edge of the functional layer 300 corresponding to the panel body cutout. An orthographic projection of an edge of the panel body cutout overlaps with an orthographic projection of an edge of the functional layer cutout in a direction perpendicular to the panel body 101.

Specifically, after the third cutting step, the functional layer cutout is formed at a position where the first protection portion is cut.

Specifically, the related description of the structure and material of the functional layer 300 can refer to the method of manufacturing the display panel as described above, which will not be repeatedly discussed here.

In an embodiment, the display panel further comprises the back plate 400 located on a side of the support layer 200 opposite to the panel body 101. A back plate cutout is disposed on an edge of the back plate 400 corresponding to the panel body cutout. An orthographic projection of an edge of the panel body cutout overlaps with an orthographic projection of an edge of the back plate cutout in a direction perpendicular to the panel body 101.

Specifically, after the third cutting step, the back plate cutout is formed at a position where the second protection portion is cut.

Specifically, the related description of the structure and material of the back plate 400 can refer to the method of manufacturing the display panel as described above, which will not be repeatedly discussed here.

In an embodiment, the edge of the panel body 101 comprises two panel body cutouts respectively disposed on side edges of the panel body adjacent to the sub-binding region T12.

Specifically, before cutting the mark cutting portion 102, the mark cutting region T2 may comprise two sub-mark cutting regions disposed at intervals, the mark cutting portion 102 comprises two sub-mark cutting portions, and each of the mark cutting regions T2 corresponds to at least one sub-mark cutting portion.

Specifically, the two panel body cutouts may correspond to the two sub-mark cutting portions. The two sub-mark cutting portions are spaced apart, and a second mark M2 is disposed on each of the sub-mark cutting portions.

It can be understood that setting a plurality of second marks M2 can further increase the alignment accuracy to the first mark M1, increase the binding accuracy, and improve the accuracy of the display panel.

Specifically, the two panel body cutouts correspond to the two mark cutting portions 102, and the two mark cutting portions 102 may be symmetrically disposed on both side edges of the panel body 101 near the sub-binding region T12.

It can be understood that by symmetrically disposing (two-point positioning) the two sub-mark cutting portions on both side edges of the panel body 101 relative to the sub-binding regions T12 on the panel body 101, the binding accuracy at the time of bending and binding can be improved, and the appearance of the display panel obtained after the third cutting step can be more beautiful.

In an embodiment, the panel body 101 comprises at least two first marks M1 located in the sub-binding region T12. The number of the first marks M1 is equal to that of the panel body cutouts, and one of the first marks M1 corresponds to one of the panel body cutouts.

In the arrangement of one of the first marks M1 corresponding to one of the panel body cutouts, a distance between the first mark M1 and the corresponding panel body cutout is less than or equal to a distance between the first mark M1 and any one of the panel body cutout.

Specifically, two panel body cutouts correspond to two sub-mark cutting portions.

Specifically, the panel body 101 is provided with at least two of the first marks M1. The number of the first marks M1 is equal to that of the second marks M2 (sub-mark cutting portions or panel body cutouts), the distance between the first marks M1 and the corresponding panel body cutouts is less than or equal to the distance between the first marks M1 and the other panel body cutouts, or the distance between the other first marks M1 and the panel body cutouts. That is, the first marks M1 and the panel body cutouts in the same group are disposed close to each other.

It can be understood that the distance between the first mark M1 and the second mark M2 on the display panel before the third cutting step can be shortened by setting the first mark M1 close to the corresponding panel body cutout, thereby improving the alignment accuracy, reducing an alignment error caused by a long distance alignment, and further improving the binding accuracy.

In addition, the present application further provides a mobile terminal, comprising a display panel produced by the display module according to any one of the embodiments described above and a terminal body, wherein the terminal body is integrated with the display panel.

In conclusion, the present application provides the panel comprising the panel body 101 and the mark cutting portion 102. The first mark M1 is disposed on the panel body 101, and the second mark M2 is disposed on the mark cutting portion 102. The support layer 200 is disposed on the side away from the light-emitting surface of the panel, and comprises the body support portion 201 corresponding to the panel body 101 and the to-be-cut support portion 202 corresponding to the mark cutting portion 102. The opening 203 is disposed at a position of the to-be-cut support portion 202 corresponding to the second mark M2. After bending and binding, the mark cutting portion 102 and the to-be-cut support portion 202 are cut, so that the panel body cutout is formed on the panel body 101, and the support layer cutout 2011 is formed on the support layer 200. By the above configuration, there is no need to provide a deep groove or opening in the support layer 200 of the display panel, thereby effectively ensuring the strength of the support layer 200, reducing the risk of cracking of the support layer 200 after being hit with a foreign object, and improving the quality of the display panel.

It can be understood that, for those of ordinary skill in the art, equivalent substitutions or changes may be made in accordance with technical solutions and inventive concepts of the present application, all of which shall fall within the scope of the claims attached to the present application.

What is claimed is:

1. A display panel comprising:
a panel body comprising a sub-binding region and derived from a panel sub-board, wherein the panel body is provided with one or more first marks located in the sub-binding region, the panel sub-board comprises a body region and a mark cutting region, the panel body is disposed in the body region, and a mark cutting portion is disposed in the mark cutting region and connected to the panel body, a second mark is disposed in the mark cutting region, and an edge of the panel body comprises at least one panel body cutout; and
a support layer located on a side of a light-emitting surface of the panel sub-board and comprising a body support portion corresponding to the body region and a to-be-cut support portion corresponding to the mark cutting region, wherein an opening is disposed in the to-be-cut support portion, an orthographic projection of the opening on the panel body covers the second mark, and a support layer cutout is disposed on an edge of the support layer corresponding to the panel body cutout;
wherein after the panel sub-board and the support layer are synchronously bent and bound, the mark cutting portion together with the second mark and the to-be-cut support portion are cut to form the panel body cutout and the support layer cutout, and an orthographic projection of an edge of the panel body cutout overlaps with an orthographic projection of an edge of the support layer cutout in a direction perpendicular to the panel body.

2. The display panel of claim 1, wherein the panel body cutout comprises a first inner groove or a first outer convex portion, and the corners of the first inner groove and the first outer convex portion are rounded;
wherein the support layer cutout comprises a second inner groove or a second outer convex portion, and the corners of the second inner groove and the second outer convex portion are rounded.

3. The display panel of claim 2, wherein a depth of the first inner groove or an outwardly protruding distance of the first outer convex portion is 0-0.3 mm.

4. The display panel of claim 1, further comprising a functional layer disposed on a side of a light-emitting surface of the panel body, wherein a functional layer cutout is disposed on an edge of the functional layer corresponding to the panel body cutout, and an orthographic projection of an edge of the panel body cutout overlaps with an orthographic projection of an edge of the functional layer cutout in the direction perpendicular to the panel body.

5. The display panel of claim 1, further comprising a back plate located between the support layer and the panel body, wherein a back plate cutout is disposed on an edge of the back plate corresponding to the panel body cutout, and an orthographic projection of an edge of the panel body cutout overlaps with an orthographic projection of an edge of the back plate cutout in the direction perpendicular to the panel body.

6. The display panel of claim 1, wherein an edge of the panel body comprises two of the panel body cutouts, and the two of the panel body cutouts are respectively disposed on side edges of the panel body near the sub-binding region.

7. The display panel of claim 1, wherein the panel body comprises at least two of the first marks located in the sub-binding region, the number of the first marks is equal to the number of the panel body cutouts, and one of the first marks corresponds to one of the panel body cutouts; and
wherein in an arrangement of one of the first marks corresponding to one of the panel body cutouts, a distance between one of the first marks and the corresponding panel body cutout is less than or equal to a distance between the one of the first marks and any one of other panel body cutouts.

8. The display panel of claim 1, wherein each of the first marks M1 is a cross-shaped or a T-shaped mark.

9. A mobile terminal comprising a display panel and a terminal body, wherein the terminal body is integrated with the display panel;
wherein the display panel comprises:
a panel body comprising a sub-binding region and derived from a panel sub-board, wherein the panel body is provided with one or more first marks located in the sub-binding region, the panel sub-board comprises a body region and a mark cutting region, the panel body is disposed in the body region, and a mark cutting portion is disposed in the mark cutting region and connected to the panel body, a second mark is disposed in the mark cutting region, and an edge of the panel body comprises at least one panel body cutout; and
a support layer located on a side of a light-emitting surface of the panel sub-board and comprising a body support portion corresponding to the body region and a to-be-cut support portion corresponding to the mark cutting region, wherein an opening is disposed in the to-be-cut support portion, an orthographic projection of the opening on the panel body covers the second mark, and a support layer cutout is disposed on an edge of the support layer corresponding to the panel body cutout;
wherein after the panel sub-board and the support layer are synchronously bent and bound, the mark cutting portion together with the second mark and the to-be-cut support portion are cut to form the panel body cutout and the support layer cutout, and an orthographic projection of an edge of the panel body cutout overlaps with an orthographic projection of an edge of the support layer cutout in a direction perpendicular to the panel body.

10. The mobile terminal of claim 9, wherein the panel body cutout comprises a first inner groove or a first outer convex portion, and the corners of the first inner groove and the first outer convex portion are rounded;
wherein the support layer cutout comprises a second inner groove or a second outer convex portion, and the corners of the second inner groove and the second outer convex portion are rounded.

11. The mobile terminal of claim 10, wherein a depth of the first inner groove or an outwardly protruding distance of the first outer convex portion is 0-0.3 mm.

12. The mobile terminal of claim 9, further comprising a functional layer disposed on a side of a light-emitting surface of the panel body, wherein a functional layer cutout is disposed on an edge of the functional layer corresponding to the panel body cutout, and an orthographic projection of an edge of the panel body cutout overlaps with an orthographic projection of an edge of the functional layer cutout in the direction perpendicular to the panel body.

13. The mobile terminal of claim 9, further comprising a back plate located between the support layer and the panel body, wherein a back plate cutout is disposed on an edge of the back plate corresponding to the panel body cutout, and an orthographic projection of an edge of the panel body cutout overlaps with an orthographic projection of an edge of the back plate cutout in the direction perpendicular to the panel body.

14. The mobile terminal of claim 9, wherein an edge of the panel body comprises two of the panel body cutouts, and the two of the panel body cutouts are respectively disposed on side edges of the panel body near the sub-binding region.

15. The mobile terminal of claim 9, wherein the panel body comprises at least two of the first marks located in the sub-binding region, the number of the first marks is equal to the number of the panel body cutouts, and one of the first marks corresponds to one of the panel body cutouts; and wherein in an arrangement of one of the first marks corresponding to one of the panel body cutouts, a distance between one of the first marks and the corresponding panel body cutout is less than or equal to a distance between the one of the first marks and any one of other panel body cutouts.

16. The mobile terminal of claim 9, wherein each of the first marks M1 is a cross-shaped or a T-shaped mark.

* * * * *